US008987769B2

(12) United States Patent
McKenzie et al.

(10) Patent No.: US 8,987,769 B2
(45) Date of Patent: Mar. 24, 2015

(54) HIGH THERMAL PERFORMANCE PACKAGING FOR OPTOELECTRONICS DEVICES

(75) Inventors: James Stuart McKenzie, Falmouth (GB); Majd Zoorob, Southampton (GB)

(73) Assignee: Photonstar LED Limited, Hants (GB)

( * ) Notice: Subject to any disclaimer, the term of this patent is extended or adjusted under 35 U.S.C. 154(b) by 245 days.

(21) Appl. No.: 12/674,553

(22) PCT Filed: Aug. 22, 2008

(86) PCT No.: PCT/GB2008/002873
§ 371 (c)(1),
(2), (4) Date: Feb. 22, 2010

(87) PCT Pub. No.: WO2009/024801
PCT Pub. Date: Feb. 26, 2009

(65) Prior Publication Data
US 2011/0204408 A1    Aug. 25, 2011

(30) Foreign Application Priority Data
Aug. 22, 2007   (GB) .................................. 0716386.8

(51) Int. Cl.
*H01L 29/72*     (2006.01)
*H05K 1/05*      (2006.01)
(Continued)

(52) U.S. Cl.
CPC .............. *H05K 1/053* (2013.01); *H01L 33/641* (2013.01); *H05K 3/388* (2013.01);
(Continued)

(58) Field of Classification Search
USPC ..................................... 257/99, 690; 315/506
See application file for complete search history.

(56) References Cited

U.S. PATENT DOCUMENTS

| 4,783,368 A | 11/1988 | Yamamoto et al. |
| 4,810,563 A | 3/1989 | DeGree et al. |

(Continued)

FOREIGN PATENT DOCUMENTS

| EP | 0 113 088 | 7/1984 |
| EP | 1 059 667 | 12/2000 |

(Continued)

OTHER PUBLICATIONS

International Search Report of corresponding International Application No. PCT/GB2008/002873, dated Feb. 6, 2009.

(Continued)

*Primary Examiner* — Edward Wojciechowicz
(74) *Attorney, Agent, or Firm* — Renner, Otto, Boisselle & Sklar, LLP

(57) ABSTRACT

A novel submount for the efficient dissipation of heat away from a semiconductor light emitting device is described, which also maintains efficient electrical conductivity to the n and p contacts of the device by separating the thermal and electrical conductivity paths. The submount comprises at least the following constituent layers: a substrate (400) with thermally conductive properties; a deposited layer (402) having electrically insulating and thermally conducting properties disposed on at least a region of the substrate having a thickness of between 50 nm and 50 microns; a patterned electrically conductive circuit layer (404) disposed on at least a region of the deposited layer; and, a passivation layer at least partially overcoating a top surface of the submount. Also described is a light emitting module employing the substrate and a method of manufacture of the submount.

19 Claims, 7 Drawing Sheets

(51) Int. Cl.
*H01L 33/64* (2010.01)
*H05K 3/38* (2006.01)

(52) U.S. Cl.
CPC .............. *H05K 2201/0179* (2013.01); *H05K 2201/10106* (2013.01); *H01L 2224/32225* (2013.01); *H01L 2224/48091* (2013.01); *H01L 2224/48227* (2013.01); *H01L 2224/73265* (2013.01); *H01L 2924/19107* (2013.01)
USPC .............................. 257/99; 258/690; 315/506

(56) References Cited

U.S. PATENT DOCUMENTS

| | | | |
|---|---|---|---|
| 6,486,499 | B1 | 11/2002 | Krames et al. |
| 6,770,498 | B2 | 8/2004 | Hsu |
| 6,884,646 | B1 | 4/2005 | Wu et al. |
| 2004/0222433 | A1 | 11/2004 | Mazzochette et al. |
| 2005/0062055 | A1 | 3/2005 | Gallup et al. |
| 2006/0091409 | A1 | 5/2006 | Epler et al. |
| 2006/0091415 | A1 | 5/2006 | Yan |
| 2006/0125387 | A1* | 6/2006 | Adachi et al. ............ 313/506 |
| 2006/0154389 | A1 | 7/2006 | Doan |
| 2006/0180828 | A1 | 8/2006 | Kim et al. |
| 2006/0268567 | A1 | 11/2006 | Jang et al. |

FOREIGN PATENT DOCUMENTS

| | | |
|---|---|---|
| JP | 60-128625 A | 7/1985 |
| WO | 2006/046221 | 5/2006 |
| WO | 2006/112478 | 10/2006 |

OTHER PUBLICATIONS

Written Opinion of the International Searching Authority of corresponding International Application No. PCT/GB2008/002873, dated Feb. 6, 2009.

UK Examination Report for corresponding Application No. GB 0716386.8, dated May 13, 211.

European Patent Office Notice of Intention to Grant for corresponding Application No. 08788432.6, dated Sep. 27, 2011.

UK Examination Report for corresponding Application No. GB 0716386.8, dated Nov. 16, 2011.

R. Meerheim, S. Scholz, S. Olthof, G. Schwartz, S. Reineke, K. Walzer, and K. Leo "Influence of charge balance and exciton distribution on efficiency and lifetime of phosphorescent organic light-emitting devices", Journal of Applied Physics 104, 014510 (2008).

Tao Zhang et al., "The Mechanical properties of AlN/BN Laminated ceramic composites", Materials Science Forum vol. 569, 2008, pp. 97-100.

\* cited by examiner

HIGH THERMAL PERFORMANCE PACKAGING FOR OPTOELECTRONICS DEVICES

This application is a national phase of International Application No. PCT/GB2008/002873 filed Aug. 22, 2008, and published in the English language as WO 2009/024801 on Feb. 26, 2009.

FIELD OF THE INVENTION

The present invention relates to an improved packaging approach for Light Emitting Diode (LED) devices.

BACKGROUND TO THE INVENTION

There are many types of packages used to manage the thermal, optical and electrical connections to small optoelectronic devices. This is due to the inherent conflict between thermal conductivity and electrical insulation when selecting suitable materials for packaging. Typical Optoelectronic devices include lasers, LEDs, detectors and photovoltaic devices. The largest challenges associated with the packaging come from electrically pumped light emitting devices. The associated wall plug efficiency of the device dictates that the conversion from electrical energy to photons out is never unity thereby introducing substantial heating in the vicinity of the small format device.

Of particular interest to the present invention are semiconductor light emitting diodes (LED) and lasers. These comprise of a chip level small format device and are typically driven at high drive currents resulting in high power densities generated inside the material causing local heating effects.

Light emitting diodes are based on a forward biased p-n junction. LEDs have recently reached high brightness levels that have allowed them to enter into new solid state lighting applications as well as replacements for high brightness light sources such as light engines for projectors and automotive car headlights. These markets have also been enabled by the economical gains achieved through the high efficiencies of LEDs, as well as reliability, long lifetime and environmental benefits. These gains have been partly achieved by use of LEDs that are capable of being driven at high currents and hence produce high luminous outputs while still maintaining high wall plug efficiencies.

The efficiency of the LED is critical to ensure that solid state lighting is adopted for general lighting applications and be able to fulfil the environmentally friendly lighting solution for future generations. LED lighting has the potential to be up to 20 times more efficient than the incandescent light bulb and last 50-100 times longer (lasting up to 100,000 hrs) resulting in less physical waste, large energy savings and lower cost of ownership. Solid state lighting applications require that LEDs exceed efficiencies currently achievable by alternative fluorescent lighting technologies.

The current state-of-the-art chip performance is by Nichia, who quote a figure of 150 lumen per Watt of electrical drive (LPW) for a 0.1 W chip. Semileds quote a 100 LPW for a 1 W chip. Phillips quote a figure of 115 LPW for a 1 W chip. The theoretical maximum is between 260 LPW and 330 LPW depending on the colour temperature of the white light generated. The present LPW efficacy at 1 W drive amounts to a wall plug efficiency of 38% thus >60% of the electrical drive current is converted to heat. Typically so called power chips are about 1 mm sq and are driven between 1-3 W. This amounts to a thermal load density of 0.6 to higher than 1.8 W/mm$^2$. This is a high figure compared to any other semiconductor device and leads to the need to provide specific high performance packaging solutions. To date most packaging has been adapted from the IC industry where thermal densities are orders of magnitude lower 1-3 W/cm$^2$.

It is also of particular interest to maintain the small format light emitting device at a low temperature during operation as the junction temperature of the LED dramatically affects both its life time and its overall efficiency. As a basic rule every 10° C. increase (above 25° C.) in junction temperature reduces the life time of the LED by 10 kHrs for a Galium Nitride LED. It is also a consequence of the increase of the junction temperature that the overall efficiency of a state of the art vertical type LED drops, for example, increasing the junction temperature from 40° C. to a 70° C. will reduce the efficacy of the LEDs by more than 10%. It is noted that this effect increasingly becomes nonlinear in behaviour. Thus, appropriate packaging solutions need to be developed to ensure performance is maintained and the operating temperature of the light emitting device is maintained for a given change in the junction temperature as well as the ambient temperature.

The Thermal Resistance of a package is the measure of how well a package can conduct heat away from the junction of the LED. Current state of the art modules have a thermal resistance of between 4 and 8 K/W.

Many methods have been successfully employed to improve the thermal resistance of LED module packages. These include the use of shaped metal lead frames in array formats U.S. Pat. No. 6,770,498, the use of bulk Aluminium Nitride ceramic tiles with electrical tracking on top in U.S Patent Application 2006/0091415A1 and the use of flip chip LEDs onto tracked ceramic tiles with through vias to allow surface mounting U.S Patent Application 2006/0091409A1.

The LEDs themselves have been engineered to produce a low thermal resistance path from the junction to the package where the heat is spread such as the flip chip approach described above (U.S Patent Application 2006/0091409A1) where the junction is very close to the package. Another approach to provide LEDs with high current and thermal driving capabilities the vertical type n-p contact configuration in GaN material systems has been recently adopted an example of which has been disclosed in U.S. Pat. No. 6,884,646 and published U.S. Patent application 20060154389A1. The disclosed devices use high thermal conductivity materials such as Copper to provide low thermal resistance from the junction to the package. More recently, improvements to these vertical type LED designs with respect to optical extraction performance promise even greater wall plug efficiency chips, as described in UK patent applications 0704120.5 and 0714139.3.

Insulated Metal Core Printed Circuit Boards

The use of insulated metal substrate printed circuit boards (IMS-PCB) are common place and are as described in U.S. Pat. No. 4,810,563. These are use in many applications including LEDs. The structure of this approach is shown in FIG. 1.

The metal substrate 100 is commonly Aluminium or copper and ranges in thickness between 0.5 mm to 3.2 mm. On top of the substrate is an adhesive layer 101 typically consisting of particulate loaded epoxy. The particulates are chosen to increase the thermal conductivity and include Aluminium Nitride, Diamond and Beryllium Nitride. The choice of materials for the adhesive layer 101 is important as the IMS PCB will undergo solder operations with temperatures used during reflow being as high at 320° C.

Layer 102 is a polyamide film. On top of this is an electrical circuit layer 103 that usually consists of copper. Layer 103 has two functions, one is heat spreading and the other is to provide the electrical circuit layout for the application. On top of this is layer 104 an insulator to prevent surface short circuits and corrosion.

Typically, to get the required electrical isolation using a polyamide material (layer 102) of kilovolts, a 75 micron thick sheet is needed. For this the thermal conductivity is only 2.2 W/(m·K). This is adequate for power electronics where thermal load densities are of the order of Watts/square cm and a significant improvement in performance above FR4 circuit boards. However if this type of IMS-PCB is used with the LED placed directly on the PCB then high junction temperatures will occur as the thermal load will not be able to spread adequately in layer 103.

The IMS-PCB is widely used in the LED packaging industry as it can be used to mount ceramic packages which perform the function of heat spreading and thus make the thermal load equivalent to that of power electronics. In addition to this advantage the IMS-PCB can be machined with holes to allow mechanical attachment to a heat sink.

Of course, all these layers of packaging create extra cost and extra interfaces that increase thermal resistance. The best LEDs packaged in ceramic modules on IMS-PCBs provide a thermal resistance of about 8 K/W from the junction to the base of the module. An LED packaged in this way is shown in FIG. 2.

The metal substrate 201 has the adhesive layer 202 attaching a polyamide electrical insulation layer 203. On top of this is the metal circuit tracking layer 204. This assembly 201, 202, 203 and 204 is the IMS-PCB 221. On top of this is soldered or bonded using layer 205 the electrically insulating but thermally conducting ceramic tile (214) with the LED (212) attached by a solder or adhesive layer 213. The ceramic tile, 214, can be any number of ceramics such as alumina or aluminium nitride. The top electrical connection from the LED (212) to the electrical circuit layer 208 on the top of the ceramic tile (214) is via a wire bond 211. The electrical circuit layer 208 is in electrical contact with the bottom electrical circuit layer 206 through the use of an electrical via 207. The bottom electrical contact of the LED 212 is in electrical contact with the top electrical contact 215 of the ceramic tile through the use of a solder joint 213. This is in turn in electrical contact with the bottom side (217) of the ceramic tile 214 through the use of additional electrical via or vias 216.

The use of the thermally conductive ceramic tile 214 ensures that the large bottom contact 220 acts as the thermal path to the IMS PCB 221 but there is no electrical connection as no electrical via's are used in this section of the ceramic title 214. Thus, the top electrical contact to the LED and the bottom electrical contact to the LED are separated through the used of the IMS PCB 221 and any heat sink attached to the bottom side of the IMS PCB 221 is electrically isolated. This is an important issue if typical metal, graphite or conductive plastic heat sinks are used to prevent the heat sink becoming electrically live. The LED (212) is encapsulated with a non conducting epoxy or silicone encapsulant 210, held in a cup or receptacle 209 to allow good light extraction. Lenses are often used in addition, although this is not depicted here. The use of a ceramic tile allows for smooth surface to attach the LED onto, with LED solder joints being as thin as 3 um (gold tin solders) the surface morphology of the ceramic tile should be similar.

By cutting into the metal core of the IMS PCB and soldering a ceramic tile in direct contact with the core of the board the thermal resistance can be reduced. The best LEDs packaged using Aluminium Nitride ceramic tiles soldered into the core of the IMS PCB offer thermal resistance of 4 K/W from the junction to the base of the modules.

An LED packaged in this way is shown in FIG. 3. The metal substrate 301 has the adhesive layer 302 attaching a polyamide electrical insulation layer 303. On top of this is the metal circuit tracking layer 304. This assembly 301, 302, 303 and 304 is the IMS-PCB 316. The electrical tracking of the IMS-PCB 316 and the electrical circuit layer 306 of the ceramic tile 317 are electrically connected to together through the use of wire bonds 305. The ceramic tile, 317, can be any number of ceramics, such as alumina or aluminium nitride, although aluminium nitride is preferred due to its high thermal conductivity. The top electrical connection from the LED (309) to the electrical circuit layer 306 on the top of the ceramic tile (317) is via a wire bond 307. The bottom electrical contact of the LED 309 is in electrical contact with the top electrical contact 312 of the ceramic tile through the use of a solder joint 308.

The use of the thermally conductive ceramic tile 317 ensures that there is a low resistance thermal path to the metal substrate 301. Thus the top electrical contact to the LED and the bottom electrical contact to the LED are separated through the used of the IMS PCB 316 and any heat sink attached to the bottom side of the IMS PCB 316 is electrically isolated through the use of the ceramic tile 317. This is an important issue if typical metal, graphite or conductive plastic heat sinks are used to prevent the heat sink becoming electrically live. The LED (309) is encapsulated with a suitable encapsulant such non conducting epoxy or silicone encapsulant 310, held in a cup or receptacle 311 to allow good light extraction. Lenses are often used in addition, although this is not depicted here.

Despite developments in the field, there is a need for a simplified packaging of LEDs and a reduction in the thermal resistance path in the packaging.

SUMMARY OF THE INVENTION

According to a first aspect of the present invention, there is provided a submount for the attachment of a semiconductor device, the submount having heat dissipating and thermal conducting properties and at least the following constituent layers:

a substrate with thermally conductive properties;

a deposited layer having electrically insulating and thermally conducting properties disposed on at least a region of the substrate having a thickness of between 50 nm and 50 microns;

a patterned electrically conductive circuit layer disposed on at least a region of the deposited layer; and, a passivation layer at least partially overcoating a top surface of the submount.

The present invention provides a novel submount for the efficient heat dissipation away from a semiconductor light emitting device while still maintaining efficient electrical conductivity to the n and p contacts. The high thermal and high electrical conductivity paths are separated in order to achieve efficient operation.

Preferably, the submount includes a first deposited buffer layer having thermally conductive properties to aid adhesion and is interdisposed between the said substrate and said deposited layer.

It is further preferred that the submount additionally includes a second deposited buffer layer having thermally conductive properties to aid adhesion and is interdisposed between said deposited layer and said patterned electrically conductive circuit layer.

The first and second deposited buffer layer may include but not restricted to the following materials; metals, semiconductors, metal oxides, metal nitrides, dielectrics, polymer, hydrocarbons, epoxies, resins or mixtures thereof.

The deposited layer may include but not restricted to the following materials; diamond like Carbon, Silicon Nitride, Aluminium Oxide, Aluminium Nitride and other such electrical insulators with thermal conductivity greater than 130 W/(m·K).

According to a second aspect of the present invention a light emitting module comprises:
  a semiconductor light emitting device;
  a submount according to the first aspect; and,
  a solder layer interspaced between the semiconductor light emitting device and the patterned electrically conductive circuit layer to provide for physical attachment.

The solder layer may also provide electrical contact subject to the light emitting device n and p contact format. The solder layer may comprise of a eutectic solder or other solder alloys.

The semiconductor light emitting device of the present invention may comprise of LEDs with a vertical type current path, termed vertical LEDs. With a lateral type current path, termed lateral LEDs, or Flip Chip light emitting device orientations, termed Flip Chip LEDs. The semiconductor light emitting device may also comprise of a Laser Diode (LD) or Photodiode or PhotoVoltaic Solar cell.

According to a third aspect of the present invention there is provided a method of manufacture of the submount of the first aspect, or the module of the second aspect, wherein the first and/or second buffer layer is deposited by an evaporation or spattering technique selected from a group which includes Plasma enhanced, Ion Beam assisted, electron beam assisted, Remote Plasma assisted, open field and closed field magnetron sputtering.

The present invention provides a means of allowing continuous high power injection into a small format light emitting device while ensuring that the light emitting module that the light emitting device is affixed to maintains a low operating temperature providing for maximum efficiency and the longest lifetimes. The light emitting module of the present invention allows the heat to be rapidly conducted away from the light emitting module to a connected heat sink whilst still providing isolation between the electrical path(s) needed to drive the light emitting device and the connected heat sink.

The present invention achieves its aims through the use of a new class of High Power Density IMS-PCBs (or HPD IMS-PCB) designed to deal with thermal power densities of ~Watts/mm². A benefit of the present invention is that the use of new manufacturing techniques, processes and materials allow thermal resistance of <1.5 K/W to be achieved, particularly if used with state of the art high drive current vertical LED devices. Other advantages of the present invention will become apparent to those skilled in the art.

BRIEF DESCRIPTION OF THE DRAWINGS

Examples of the present invention will now be described in detail with reference to the accompanying drawings, in which.

DETAILED DESCRIPTION OF THE INVENTION

Figure 1:
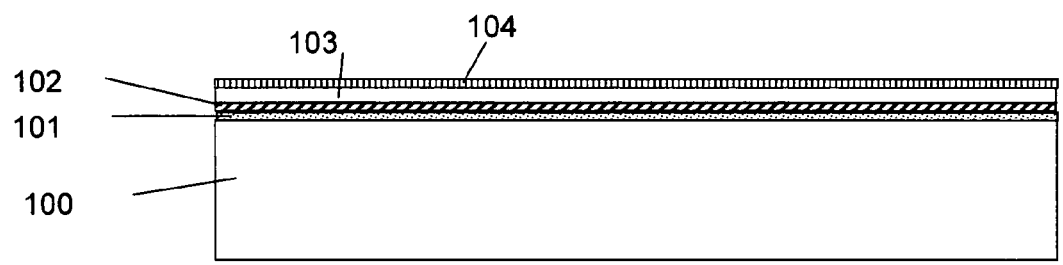
FIG. 1 shows a cross section of a known insulated metal substrate printed circuit board (IMS-PCB)
Figure 2:
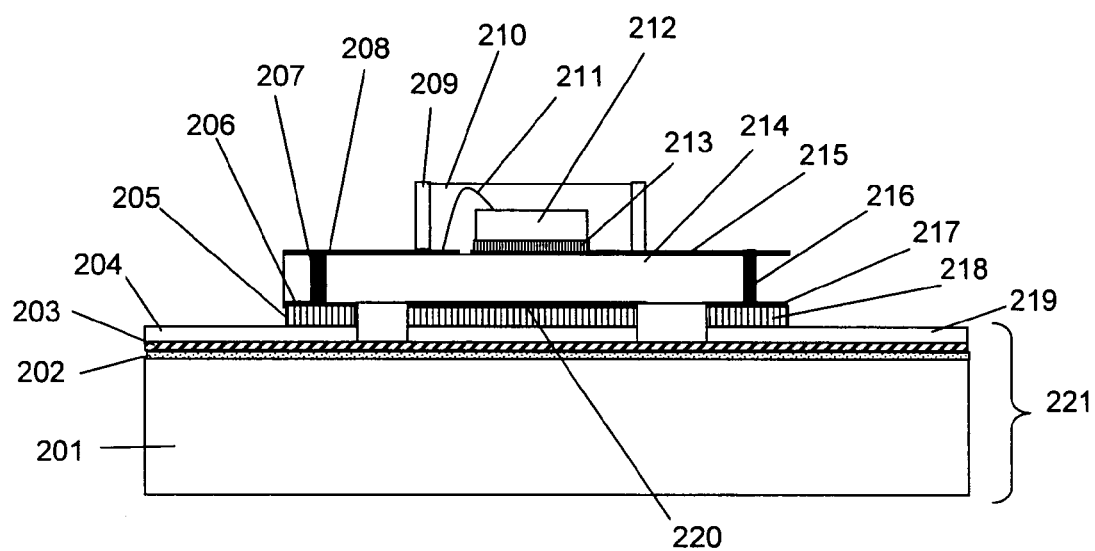
FIG. 2 shows a cross section of a known LED package where the LED is mounted on a ceramic tile with conductive vias which is also attached to a IMS-PCB.
Figure 3:
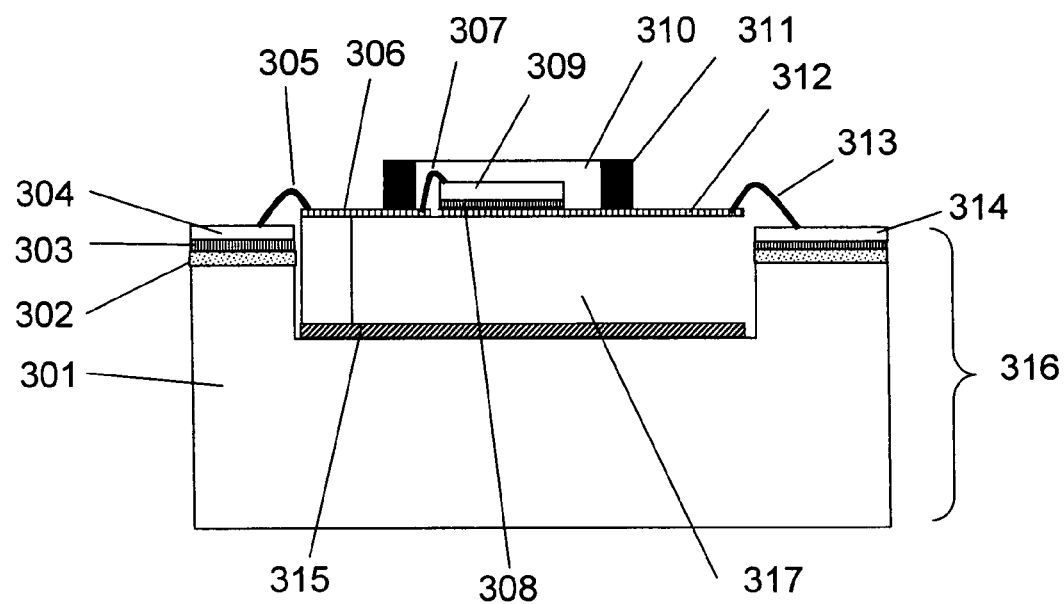
FIG. 3 shows a cross section of a known LED package where the LED is mounted on a ceramic tile which is mounted in direct thermal contact with the core of an IMS-PCB.

The thermal conductivity of a material can be defined as follows:

$$k = \frac{Q}{t} \times \frac{L}{A \times \Delta T} \qquad (1)$$

where Q is the quantity of heat transmitted in time t through a thickness L in a direction normal to a surface of area A, due to a temperature difference $\Delta T$, under steady state conditions and when the heat transfer is dependent only on the temperature gradient.

In order to reduce the temperature difference across a defined region in a submount a material with a higher thermal conductivity can be employed, additionally a thinner material may also be implemented. However, care has to taken that reducing the thickness still maintains good electrical insulation and maintains high electrical breakdown voltages. Table 1 contains a list of thermal conductivities for common materials used in semiconductors, light emitting devices, and LED packaging.

TABLE 1

| Material | Thermal Conductivity W/(m · K) | CTE (10⁻⁶/K) @ 20° C. |
|---|---|---|
| Alumina | 18 | 6.9 |
| Aluminum Nitride | 170 | 4.7 |
| AuSn solder | 57 | 16 |
| Copper | 400 | 17 |
| Aluminium | 237 | 24 |
| Tungsten | 160 | 4.3 |
| Silver | 419 | 18 |
| Gold | 318 | 14 |
| GaN | 130-225 | 3.1 |
| Sapphire | 40 | 8.4 |
| Silicon | 150 | 2.6 |
| Diamond | 900-1900 | 1.18 |

The thermal resistance is the inverse of thermal conductivity. If a Gallium Nitride LED is considered, this has a thermal conductivity of between 130 to 225 W/(m·K) then the deposited and substrate materials for the submount should be chosen to be no worse than these otherwise the overall thermal resistance will be increased. As the junction temperature of the LED is sensitive to increases in temperature, the materials constituting the submount should be chosen carefully to ensure the thermal resistance is minimised. An ideal material for thermal performance would be a diamond heat spreader and heat sink, however the cost would be prohibitive for most applications.

Table 1 also lists the coefficient of thermal expansion (CTE) for the same materials. Ensuring good matches between the submount materials and the semiconductor light emitting device material eliminates stress build up during soldering. This will improve the overall reliability of the light emitting module when high power densities are injected into the LED or laser diode device.

Stress can also be managed through the use of adhesion and buffering layers that have CTE coefficients residing between that of the materials being buffered, for example an adhesion and buffering layer may be deposited between underlying submount substrate and the deposited high thermal conductivity layer. This is an important factor in joining materials of different CTE in order to improve reliability. Another example where a buffering layer can be deposited is between the deposited high thermal conductivity layer and the electrically conductive circuit layer of the submount.

Recent advances in low temperature deposition technology such as Plasma assisted or enhanced deposition, Ion Beam assisted deposition, electron beam assisted deposition, Remote Plasma assisted deposition, open and closed field magnetron sputtering have recently allowed materials to be deposited with controlled stress and high deposition rates (nanometers per minute typically) at temperatures near room temperature (or lower through the use of cryogenically cooled substrates or higher through the use of heated substrates). These new techniques allow materials to be deposited with near bulk material properties and high mechanical integrity. As the layers are put down at low and controlled temperatures the adhesion between layers is excellent. Although as solder processes are used to attach LED die to the package stress will be locked in at the solder hardening point (as high as 300° C.) the use of controlled stress layers and controlled temperature deposition additionally allows stress to be appropriately managed within the layers of the package to minimise this.

Figure 4:
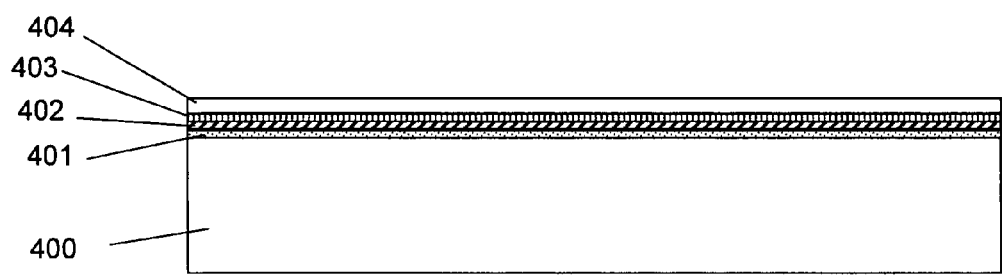
FIG. 4 shows a cross section of a high power density insulated metal substrate printed circuit board of the present invention capable of handling a thermal load of 1-3 W/mm² with a thermal resistance below 1.5 W/(m·K)

FIG. 4 shows a preferred embodiment of the invention a HPD IMS-PCB. 400 is the metal substrate, this can be any metal or alloy that has high thermal conductivity (in excess of 130 W/(m·K) such as but not restricted to Copper, alloys of Copper, Copper Tungsten, Aluminium and layers of conductive metals or layers of graphite.

Layer 401 provides adhesion between the substrate 400 and 402. Layer 401 also provides a stress buffer between layers 402 and 404 with the CTE being between that of 402 and 404 and the thermal conductivity being relatively high ideally >130 W(m·K). Layer 403 can be a single layer or a multilayer stack of materials consisting on metals, dielectrics and semiconductors.

The materials in layer 401 are also chosen to manage the stress between the metal substrate and electrically insulating layer during the solder attach or LED die bonding process.

The electrically insulating layer and thermally conductive layer 402 can be a single or multiple layer of dielectrics deposited at a controlled temperature and stress the preferred materials are diamond like carbon (DLC) and Aluminium Nitride as these have high thermal conductivity and high dielectric strength. Thin 150 nm DLC layers have thermal conductivities of >1000 W/(m K) and because of the high density of the film (deposited using the techniques described) achieve electrical isolation of 2 kV whilst being deposited at greater than 40 nm/minute using the above mentioned deposition techniques. Thin layers of Aluminium Nitride, 1-3 microns can exhibit electrical isolation in excess of 1 kV with deposition rates of greater than 40 nm/minute and because of the high density of the film (deposited using the techniques described) still achieve thermal conductivities of >170-200 W/(m K).

In a preferred example the layer 402, is of 150 nm, 250 nm, 500 nm, 1 micron, 2 micron or 5 micron in thickness. In another preferred example the low temperature deposition rate of layer 402 is approximately 10 nm/min, 20 nm/min, 40 nm/min or 100 nm/min. In the same preferred example the breakdown voltage of layer 402 is 0.5 kV, 1 kV, 1.5 kV or 2 kV.

Other materials that can be used include non conducting oxides and non conducting nitrides of metals and semiconductors including mixtures and multilayers of these materials. Layer 402 be any thickness between 50 nanometers to 10's of microns provided that it does not introduce a high thermal resistance and provides adequate electrical isolation for the application. Although deposition rates and times are a limiting factor in the overall thickness that layer 402 can achieve. However, it is an object of the present invention that the formation of stress and cracking associated with putting down these films using conventional PECVD or other high temperature deposition techniques is eliminated.

It is also an object of the present invention that the use of the above mentioned low temperature deposition techniques allows for smooth layers with variation in root mean square thickness less than 0.1%, 0.5%, 1%, 3% and 5%. This is beneficial to allow for improved smooth adhesion surfaces. It is another object of the present invention that using the above mentioned deposition techniques allows in-situ plasma ashing of the submount surface prior to deposition of layer 402 and hence additionally improves surface adhesion and film integrity.

Layer 403 provides adhesion between layer 402 and 404. Layer 404 is the electrical circuit layer and is comprised of metal usually copper tracking. Layer 403 also provides a stress buffer between layers 402 and 404 with the CTE being between that of 402 and 404 and the thermal conductivity being relatively high ideally >130 W(m K). Layer 403 can be a single layer or a multilayer stack of materials consisting of metals, dielectrics and semiconductors. Layer 403 may be deposited using the above mentioned deposition techniques.

Layer 404 the electrical circuit layer can be a range of metals and conductors deposited or electroplated onto the surface. The preferred material is copper. Layer 404 can be a single or multiple layer of metals with the final layer being capable of solder attach. Typically the electrical circuit layer will range from 35 to 350 microns although thicker layers for enhanced power handling can be employed.

HPD IMS-PCB is designed to be compatible with standard IMS-PCB patterning and processing and can be used as a replacement for the LED application or any other laser diode application. As a result solder is deposited onto the HPD IMS-PCB as required and the resulting circuit layer is passivated with a dielectric during its processing.

Figure 5:
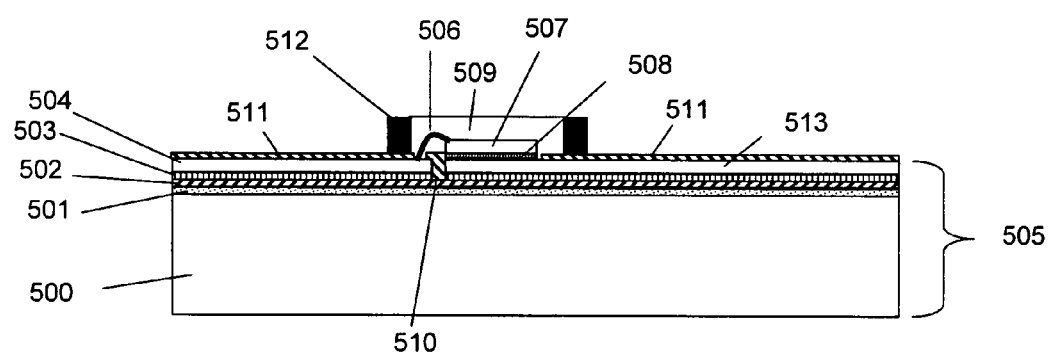
FIG. 5 shows a cross section of a substrate according to the invention used to package a vertical current type LED.
Figure 6:
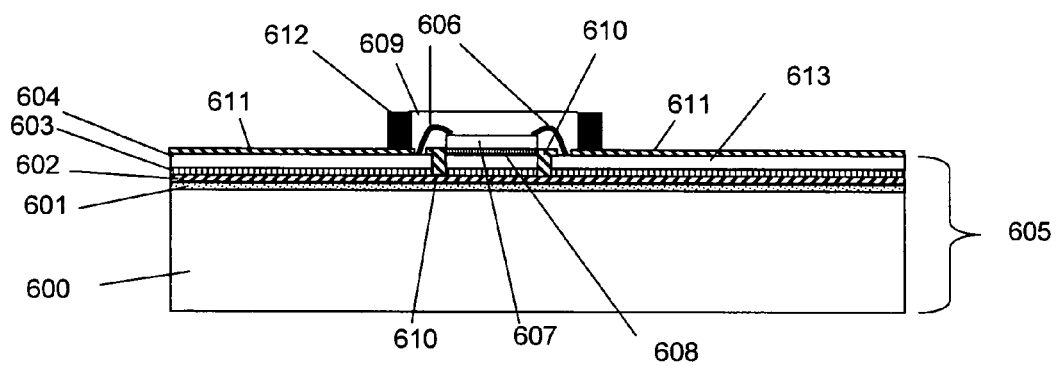
FIG. 6 shows a cross section of a substrate according to the invention used to package a lateral current type LED; and, FIG. 7 shows a cross section of a substrate according to the invention used to package a flip-chip type LED.
Figure 7:
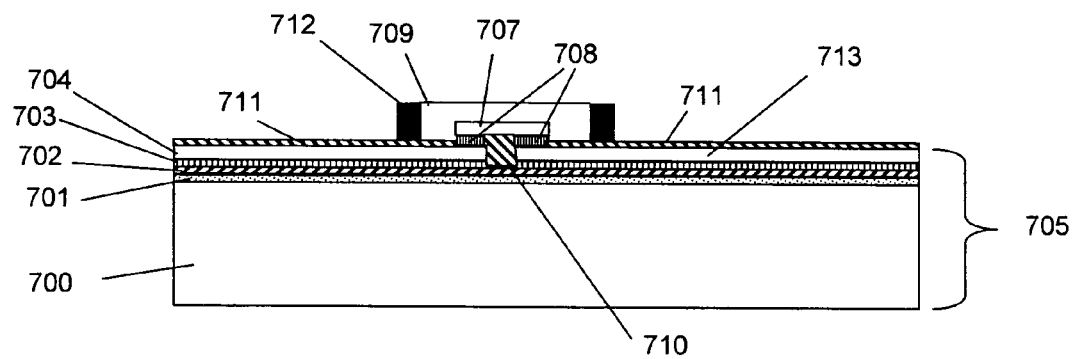

Example light emitting device modules employing the submount of the present invention, namely the HPD IMS-PCB, and three different type of LED chips are shown in FIGS. 5, 6 and 7.

FIG. 5 shows a vertical LED on the submount HPD IMS PCB forming a light emitting device module. The HPD IMS-PCB 505 is comprised of the metal substrate 500, the buffer and adhesion layers 501, the electrically insulating thermally conducting dielectric layers 502, buffer and adhesion layers 503 and the electrical tracking layer 504. The bottom contact of the LED, 507 is soldered by means of a layer of solder, 508 onto the electrical circuit layer 504. The top contact of the LED (507) is wire bonded onto a track in the electrical circuit layer 504. The circuit layer is patterned into electrical tracks and the tracks are separated by etching through the electrical circuit layer (and the adhesion layer 503) forming separate tracks 504 and 513. This etch is passivated with 510 an insulator deposited, coated or sprayed on to the HPD IMS PCB at the same time as the passivation layer 511. The top and bottom contacts of the LED are thus electrically connected only through the LED (507).

Additional components, such as zener diodes, resistors, ICs and other electrical components, may also be soldered onto the tracks on the circuit layer 504 as well as wires to external circuit boards. The LED (507) is encapsulated with a suitable encapsulant such as non conducting epoxy or silicone encapsulant 509, held in a cup or receptacle 512 to allow good light extraction. Lenses are often used in addition, although this is not depicted as this is not the focus of this invention.

FIG. 6 shows a lateral type LED on the submount HPD IMS PCB forming a light emitting device module. The HPD IMS-PCB 605 is comprised of the metal substrate 600, the buffer and adhesion layers 601, the electrically insulating thermally conducting dielectric layers 602, buffer and adhesion layers 603 and the electrical tracking layer 604. The LED, 607 is soldered onto the electrical circuit layer 604 by means of a solder layer 608, and both n and p electrical contacts of the LED (607) are wire bonded (606) onto separate circuit tracks on the electrical tracking layer 604. The circuit layer is patterned into electrical tracks and the tracks are separated by etching through the electrical circuit layer 604 (and the adhesion layer 603) forming separate tracks 604 and 613. This etch is passivated with 610 an insulator deposited, coated or sprayed on to the HPD IMS PCB at the same time as passivation layer 611. Both electrical contacts of the LED are thus electrically connected to the separate tracks 604 and 613 only through the LED (607).

Additional components, such as zener diodes, resistors, ICs and other electrical components, may also be soldered onto the circuit layer 604 as well as wires to external circuit boards. The LED (607) is encapsulated with a suitable encapsulant such as non conducting epoxy or silicone encapsulant 609, held in a cup or receptacle 612 to allow good light extraction. Lenses are often used in addition, although this is not depicted as this is not the focus of this invention.

FIG. 7 shows a flip chip type LED on the submount HPD IMS PCB forming a light emitting device module. The HPD IMS-PCB 705 is comprised of the metal substrate 700, the buffer and adhesion layers 701, the electrically insulating thermally conducting dielectric layer 702, buffer and adhesion layers 703 and the electrical tracking layer 704. Both of the contacts of the flip chip LED, 707 are soldered onto separate circuit tracks by means of solder layer 708 on the electrical tracking layer 704. The circuit layer is patterned into electrical tracks and the tracks are separated by etching through the electrical circuit layer 704 (and the adhesion layer 703) forming separate tracks 704 and 713. This etch is passivated with 710 an insulator deposited, coated or sprayed on to the HPD IMS PCB at the same time as passivation layer 711. The 2 anode and cathode contacts of the LED are thus electrically connected only through the LED (707).

Again, additional components such as zener diodes, resistors, ICs and other electrical components may also be soldered onto the circuit layer 704 as well as wires to external circuit boards. The LED (707) is encapsulated with a suitable encapsulant such as non conducting epoxy or silicone encapsulant 709, held in a cup or receptacle 712 to allow good light extraction. Lenses are often used in addition, although this is not depicted as this is not the focus of this invention.

The invention claimed is:

1. A submount for the attachment of a semiconductor device, the submount having heat dissipating and thermal conducting properties and at least the following constituent layers:
   a substrate formed of a material with thermal conductivity greater than 130 W/(m.K);
   an isolation layer disposed on at least a region of the substrate, wherein the isolation layer is conformal with the substrate and is formed with controlled stress using a low temperature deposition technique, where the isolation layer has a thickness of between 50 nm and 50 microns and comprises an electrically insulating material with an electrical breakdown voltage of at least 0.5kV and a thermal conductivity greater than 130 W/(m.K); and
   a patterned electrically conductive circuit layer disposed on at least a region of the isolation layer.

2. A submount according to claim 1, further comprising a first buffer layer interdisposed between the substrate and the isolation layer to aid adhesion therebetween, wherein the first buffer layer is a deposited layer conformal with the substrate and comprises a material with thermally conductive properties, and the first buffer layer has a coefficient of thermal expansion that is between the coefficients of thermal expansion of the substrate and the isolation layer.

3. A submount according to claim 1, further comprising a second buffer layer interdisposed between the isolation layer and the patterned electrically conductive circuit layer to aid adhesion therebetween, wherein the second buffer layer is a deposited layer conformal with the substrate and comprises a material with thermally conductive properties, and the second buffer layer has a coefficient of thermal expansion that is between the coefficients of thermal expansion of the isolation layer and the patterned electrically conductive circuit layer.

4. A submount according to claim 2, wherein the first buffer layer comprises a material selected from a group which includes metals, semiconductors, metal oxides, metal nitrides, dielectrics, polymer, hydrocarbons, epoxies, resins or mixtures thereof.

5. A submount according to claim 1, wherein the electrically insulating material of the isolation layer is selected from a diamond, diamond-like Carbon, and Aluminium Nitride.

6. A light emitting module comprising:
   a semiconductor light emitting device;
   a submount according to claim 1; and,
   a solder layer interspaced between the semiconductor light emitting device and the patterned electrically conductive circuit layer to provide for physical attachment.

7. A module according to claim 6, wherein the semiconductor light emitting device comprises a vertical type current path.

8. A module according to claim 6, wherein the semiconductor light emitting device comprises a lateral type current path.

9. A module according to claim 6, wherein the semiconductor light emitting device is configured with a Flip-Chip light emitting device orientation.

10. A module according to claim 6, wherein the solder layer comprises eutectic solder or solder alloy mixtures.

11. A submount according to claim 1, further comprising a passivation layer at least partially overcoating a top surface of the submount.

12. A submount according to claim 1, wherein the electrically insulating material of the isolation layer is selected from Silicon Nitride, and Aluminium Oxide.

13. A submount according to claim 1, wherein the substrate comprises a material selected from Copper, alloys of Copper, Copper Tungsten, Aluminium, layers of conductive metals, and layers of graphite.

14. A submount according to claim 2, wherein the first buffer layer comprises a material with thermal conductivity greater than 130 W/(m.K).

15. A submount according to claim 3, wherein the second buffer layer comprises a material with thermal conductivity greater than 130 W/(m.K).

16. A submount according to claim 3, wherein the second deposited buffer layer comprises a material selected from metals, semiconductors, metal oxides, metal nitrides, dielectrics, polymer, hydrocarbons, epoxies, resins or mixtures thereof.

17. A submount according to claim 1, wherein the isolation layer has a variation in root mean square thickness of one of less than 0.1%, 0.5%, 1%, 3%, and 5%.

18. A submount according to claim 1, wherein the isolation layer includes layers of diamond-like carbon (DLC) with an electrical breakdown voltage of at least 1.5kV.

19. A submount according to claim 1, wherein the isolation layer has a thermal conductivity greater than 1000 W/(m.K).

* * * * *